United States Patent [19]
Durand et al.

[11] Patent Number: 5,103,187
[45] Date of Patent: Apr. 7, 1992

[54] MICROWAVE TUBE AMPLIFIER STAGE WITH WIDE BAND AND LOW DISPERSIVITY IN FREQUENCY

[75] Inventors: Alain Durand, Velizy Villacoublay; Olivier Rabot, Centilly, both of France

[73] Assignee: Thomson-CSF, Puteaux, France

[21] Appl. No.: 678,240

[22] Filed: Apr. 1, 1991

[30] Foreign Application Priority Data

Apr. 13, 1990 [FR] France ............... 90 04810

[51] Int. Cl.⁵ .................................. H03F 3/58
[52] U.S. Cl. ........................ 330/43; 315/3.5; 315/39.3
[58] Field of Search ............ 315/3.5, 3.6, 39.3; 330/43, 44, 45; 358/184

[56] References Cited

U.S. PATENT DOCUMENTS

| | | | |
|---|---|---|---|
| 2,435,601 | 2/1948 | Ramo | 332/147 |
| 3,080,523 | 3/1963 | Miller | 328/38.1 |
| 3,614,516 | 10/1971 | Phillips | 315/3.6 |
| 3,614,517 | 10/1971 | Dionne | 315/3.6 |
| 4,564,787 | 1/1986 | Kosmahl | 330/43 |

FOREIGN PATENT DOCUMENTS 2186776 1/1974 France .

OTHER PUBLICATIONS

Soviet Inventions Illustrated, Derwent Publications Ltd., Section Electrique, Semaine 8551, Abrege Nr. 322882, U23, 14 Jan. 1986 & SU -A-1162015 6-15-85.

*Primary Examiner*—Steven Mottola
*Attorney, Agent, or Firm*—Oblon, Spivak, McClelland, Maier & Neustadt

[57] ABSTRACT

This amplifier stage comprises a microwave tube wherein an electron beam (3) is made to interact with a microwave having a frequency variable within a given useful range, the velocity of the electrons of the beam being determined by a cathode voltage ($V_k$) applied to the tube and the microwave being propagated in said delay structure (4) that imposes a phase velocity close to the velocity of the electron beam on said microwave. The cathode voltage is a variable voltage, regulated as a function of said frequency, said voltage varying with the frequency to modify the velocity of the electrons of the beam in such a way that, for every frequency of said useful range of frequencies, the corresponding velocity of these electrons remains essentially, but not precisely, identical to the phase velocity of the microwave. Thus, the dispersivity in frequency of the delay structure is compensated for, and the output power delivered by the tube is thus kept essentially constant.

10 Claims, 3 Drawing Sheets

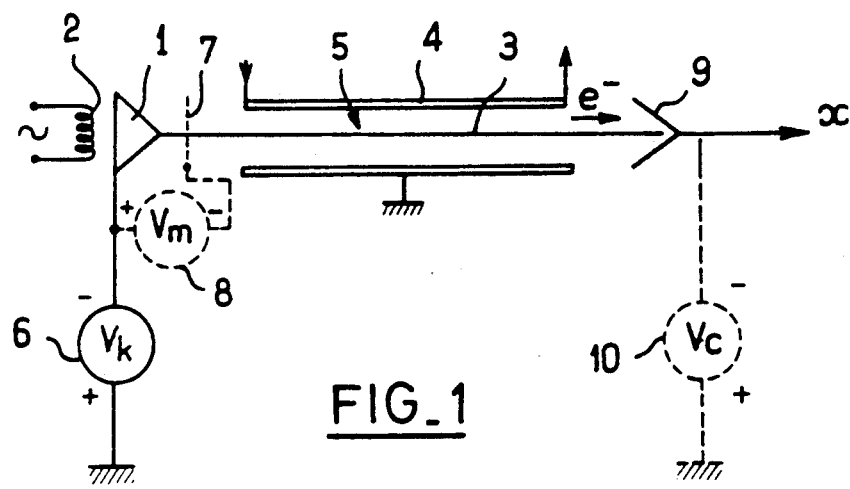
FIG._1
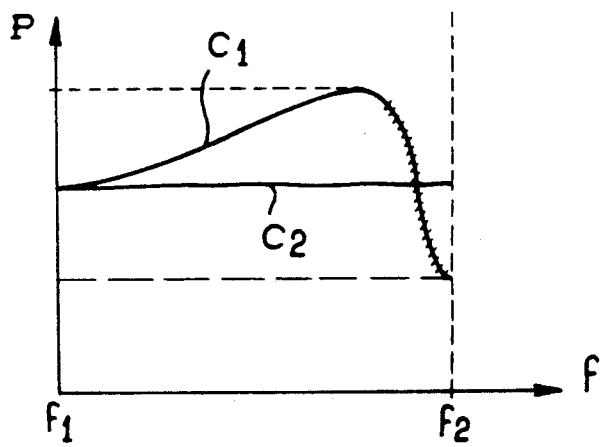
FIG._2
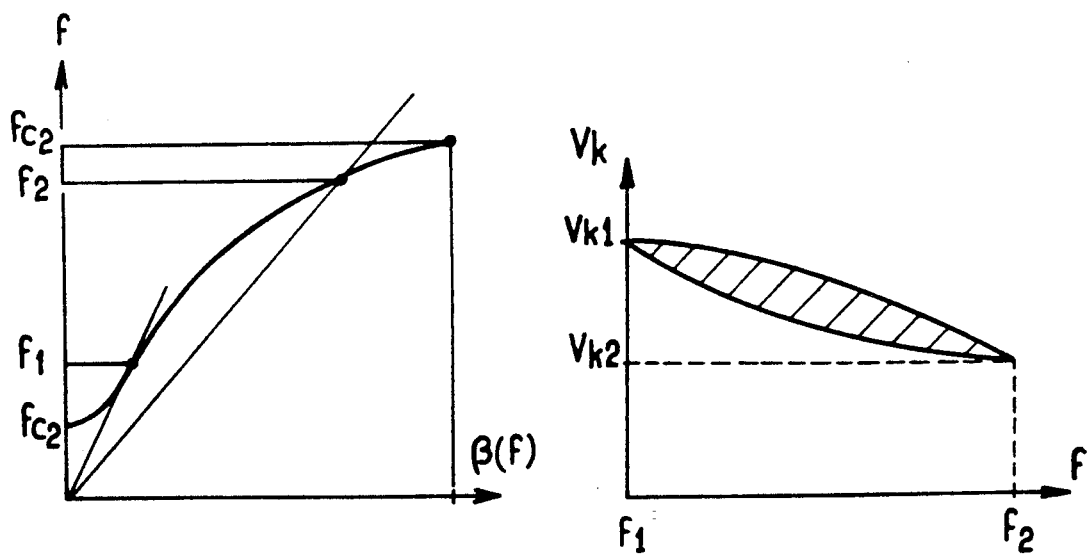
FIG._3
FIG._4

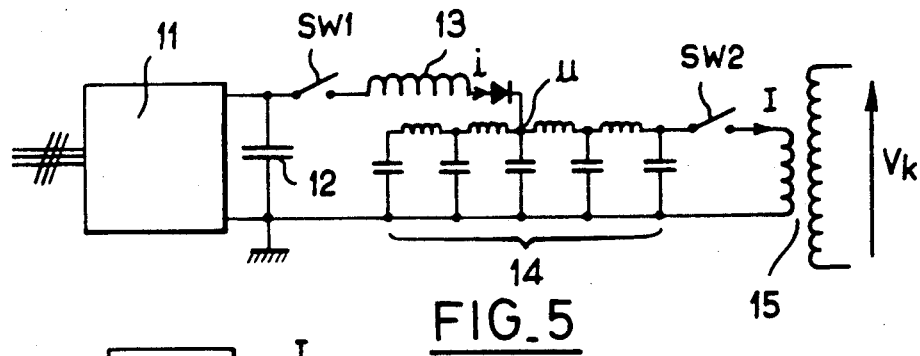
FIG.5
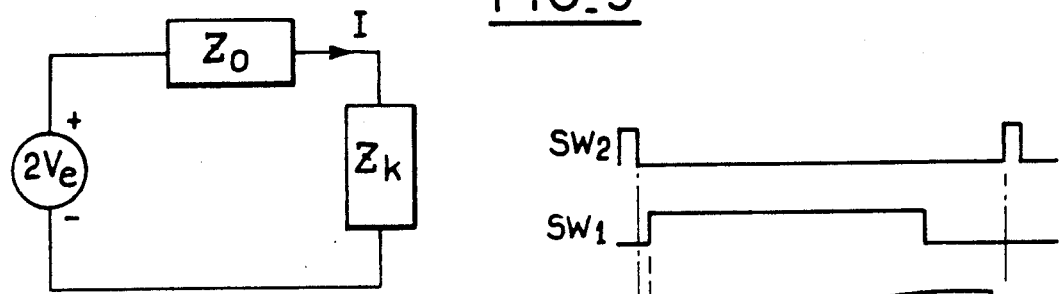
FIG.6
FIG.7
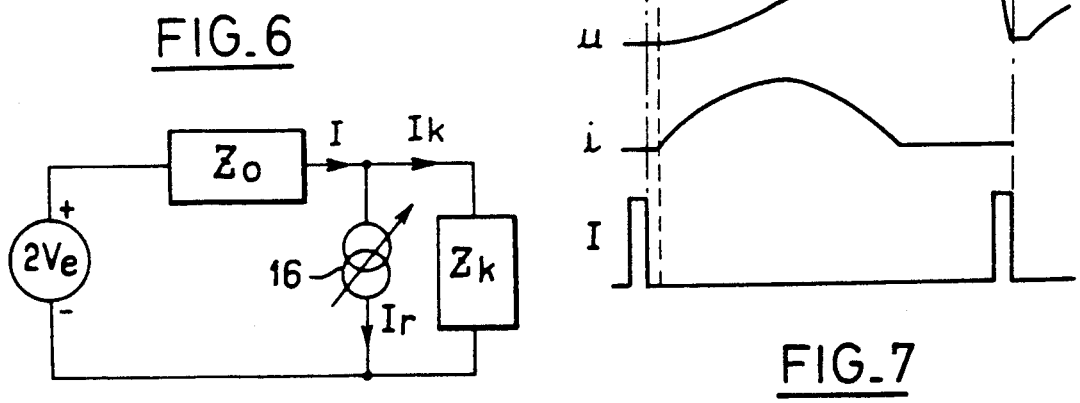
FIG.8
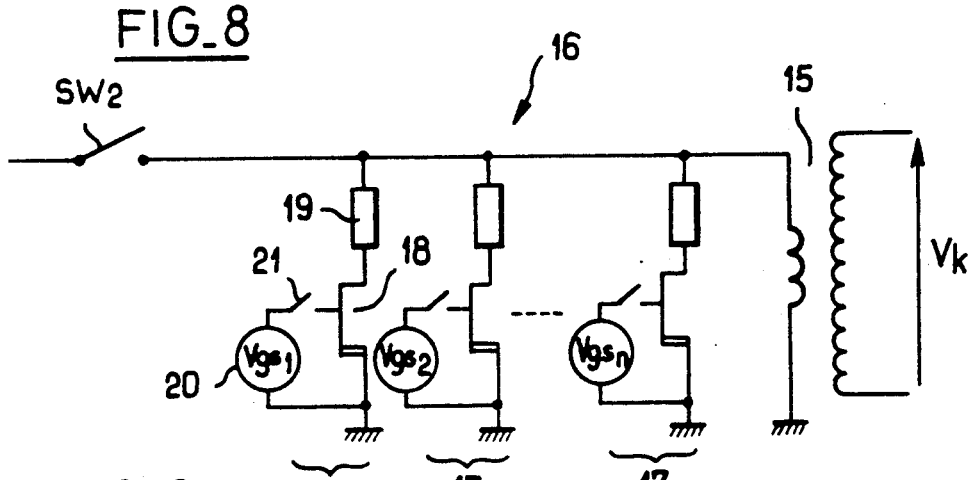
FIG.9

MICROWAVE TUBE AMPLIFIER STAGE WITH WIDE BAND AND LOW DISPERSIVITY IN FREQUENCY

BACKGROUND OF THE INVENTION

1. Field of the Invention

The present invention relates to an amplifier stage comprising a microwave tube in which an electron beam interacts with a microwave.

2. Description of the Prior Art

According to standard practice, the electron beam is accelerated by a very high cathode voltage, typically of the order of 40 to 70 kV.

Furthermore, in radar applications, this cathode voltage is applied not continuously but in the form of square-wave voltage pulses that are as square-shaped as possible. This is why this cathode voltage is also called a "modulation voltage" when it is produced not continuously but in pulses.

Once accelerated, the electrons of the beam are made to interact with the field produced by an electromagnetic microwave (the wave to be amplified) shifting in the same direction as the beam and having comparable velocity.

This is achieved by means of a delay structure used to slow down the velocity of propagation of the electromagnetic microwave until a velocity, known as a phase velocity, of the same order as that of the electron beam, is reached.

Now, the structures used are most commonly structures that have a certain dispersivity in frequency, i.e. the rate of delay that the structure enforces on the electromagnetic wave varies with the frequency of this wave.

This is especially so for the delay structures used with high power amplifiers, such as the delay structures that are formed by a series of coupled waveguides and thus constitute so-called "coupled cavity" structures along which the velocity of the microwave is considerably slowed down, the electron beam then moving along the longitudinal axis of this structure so as to cause an interaction all along the length of said structure.

By contrast, the velocity of the electrons of the beam is essentially determined by the cathode voltage alone, so that this velocity is quasi-constant and independent of the frequency.

As a result, as and when the distance from the central operating frequency increases, a growing difference in velocity appears between the microwave and the electron beam. This difference in velocity will greatly reduce the efficiency of the interaction and will therefore greatly restrict the passband of the tube.

More specifically, at the lowest frequencies of the operating band of the tube, the phase velocity is high, so that the velocity of the electrons, comparatively speaking, is low (the velocity of the electrons of the beam nevertheless remains always greater than the phase velocity, this being an indispensable condition for it to be possible for the interaction to occur). The electrons will therefore yield only a small part of their kinetic energy to the microwave, giving a reduced gain.

By contrast, at high frequency, the phase velocity will be low, comparatively speaking, that of the electrons of the beam will be high. These electrons will therefore be able to yield a very large fraction of their kinetic energy to the microwave, thus giving a high gain.

However, if the frequency is increased excessively, the phase velocity is such that the structure goes out of the interaction range, and the gain then drops very swiftly.

It is thus seen that the amplification band of the tube is determined by the band for which the following condition is met: there should be little difference between the velocities of the electrons.

It will be noted incidentally that, if there is to be interaction, these two velocities should be close to each other but not exactly identical. If they were identical, no interaction could arise. It is this condition that shall be referred to when we use terms such as "velocities close to each other", "neighboring velocities", "essentially identical velocities" etc.

Under these conditions, to obtain a high passband, propagating lines with reduced dispersivity should be available. But then the variation in the phase velocity as a function of the frequency would be low, the coupling between the wave and the beam would also be low and, consequently, the same would be the case for the ouput power.

However, with excessively dispersive delay structures, the condition of wave/beam synchronism would met only on a narrow band, and this would therefore also be the case for the bandwidth of the tube. By contrast, since the matching on this reduced band is easier to obtain, the gain of the tube would be thereby increased.

It is thus seen that the performance characteristics of prior art stages are limited by a necessary compromise that has to be found between high output power, high gain and wide passband, these three characteristics having been mutually exclusive up till now.

One of the aims of the invention is to get rid of these limitations by proposing a microwave tube amplifier stage that has both a very wide passband and a very low variation in output power throughout this passband.

To this effect, the basic idea of the invention consists in setting up a servo-link between the velocity of the electrons and that of the propagated microwave tube in order to synchronize the velocity of the wave and that of the beam for a very wide band of frequencies.

SUMMARY OF THE INVENTION

To this end, there is proposed an amplifier stage comprising a microwave tube of the type having a cathode and a delay structure, wherein an electron beam is made to interact with a microwave having a frequency variable within a given useful range, the velocity of the electrons of the beam being determined by a cathode voltage applied to the tube and the microwave being propagated in said delay structure that imposes a phase velocity close to the velocity of the electron beam on said microwave, said amplifier stage further including supply means that give a variable cathode voltage, regulated as a function of said frequency, said voltage varying with the frequency to modify the velocity of the electrons of the beam in such a way that, for every frequency of said useful range of frequencies, the corresponding velocity of these electrons remains essentially, but not precisely, identical to the phase velocity of the microwave.

Thus, the dispersivity in frequency of the delay structure is compensated for, and the output power delivered by the tube is thus kept essentially constant.

In particular, the cathode voltage may essentially be determined by the relationship:

$$V_k(f) = [4\pi^2 f^2 / \beta(f)^2] \cdot [m/2e] + V_\xi(f).$$

$V_k(f)$ being the cathode voltage;
f being the frequency of the microwave;
$\beta(f)$ being the characteristic of dispersivity of the delay structure,
m being the mass of the electron,
e being the charge of the electron, and $V_\xi(f)$ being a corrective term providing for a velocity of the electrons and a phase velocity of the microwave such that these velocities are close to each other.

The teachings of the present invention can be applied to a great variety of tubes.

In this respect, a second aspect of the invention lies in the modulator enabling this variable voltage to be produced.

Indeed, the modulators used up till now to modulate the beams of the tubes produced a fixed voltage level and could not be used to effect any variation in this level as a function of the frequency, notably from one voltage pulse to the next one (as in so-called agile frequency radars).

The invention is therefore also designed to propose embodiments of modulators making it possible to achieve this function (the production of a servo-controlled variable voltage) constituting the general means of the invention.

In particular, if the tube is a tube with modulation by the cathode driven by a modulator forming a voltage source giving the tube an essentially constant cathode voltage, according to a first embodiment of the invention, it is possible to provide for voltage reduction means enabling the cathode voltage effectively applied to the tube to be reduced variably as a function of the frequency.

These voltage reducing means may notably include means for the branching-off, variably as a function of the frequency, of a fraction of the current delivered to the tube by said voltage source so as to achieve a correlative and controlled reduction in the cathode voltage effectively applied to the tube, given the voltage drop due to the internal impedance of said voltage source.

In this case, the voltage reducing means advantageously include a current source adjustable as a function of the frequency, mounted in a bypass connection on the cathode circuit of the tube.

This current source may especially include a plurality of parallel-connected elementary current sources (for example, each constituted by a power MOS transistor, controlled as a current generator and series-connected with a resistor of fixed value), each of these elementary current sources being selectively activated as a function of the frequency so as to obtain the desired value of branched-off current for the unit.

If, again in the case of a tube with modulation by the cathode, this tube should be driven by a modulator with controlled current source, according to a second embodiment of the invention, the controlled current source may be designed so that it is adjustable as a function of the frequency in such a way as to achieve a correlative and controlled reduction in the cathode voltage applied to the tube.

To this end, the controlled current source, adjustable as a function of the frequency, advantageously includes a plurality of parallel-connected elementary current sources (for example each constituted by a power MOS transistor controlled as a current generator), each of these elementary current sources being selectively controlled as a function of the frequency so that the value of current corresponding to the desired cathode voltage is obtained for the unit.

BRIEF DESCRIPTION OF THE DRAWINGS

We shall now describe an exemplary embodiment of the invention with reference to the appended figures.

FIG. 1 is a schematic drawing of a tube with interaction between an electron beam and a microwave.

FIG. 2 shows the variations in the output power produced by such a tube, in the case of the prior art (curve $C_1$) and in the case of the invention (curve $C_2$).

FIG. 3 shows an example of a characteristic curve of dispersion of a tube.

FIG. 4 shows the shape of the variation of the cathode voltage as a function of the frequency of the wave to be amplified, in accordance with the teachings of the invention.

FIG. 5 shows a simplified view of the structure of a delay line type modulator according to the prior art.

FIG. 6 is an equivalent diagram of the structure of FIG. 5.

FIG. 7 is a series of timing diagrams used to explain the working of the modulator of FIG. 5.

FIG. 8 is homologous to FIG. 6, for a modulator according to the invention.

FIG. 9 shows an exemplary embodiment of the variable current generator used by the modulator of FIG. 8.

DETAILED DESCRIPTION OF THE INVENTION

Figure 10:
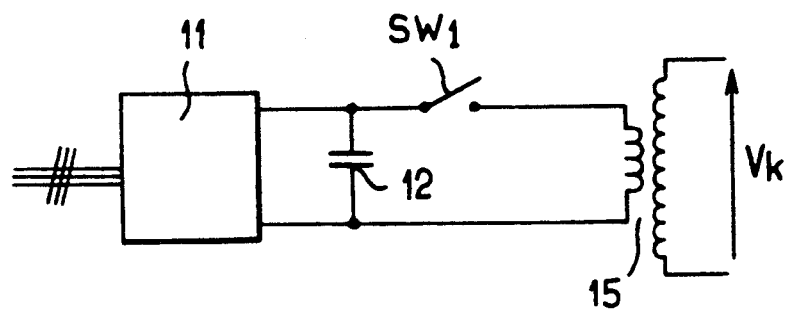
FIG. 10 illustrates another type of modulator according to the prior art, of the controlled current type.

FIG. 1 gives a schematic view of an amplifier tube and its supply circuits.

This tube essentially has a cathode 1 heated by a filament 2 so as to produce electrons by thermoelectronic effect. These electrons are accelerated by the application, to the cathode, of a voltage $V_k$ so as to produce a homokinetic beam 3.

This electron beam 3 is then made to interact with an electromagnetic microwave being propagated in a delay structure 4 (namely a coupled cavity structure, helix structure, $\pi$ line structure etc.), this interaction taking place all along the length of an interaction interval 5 defined by the geometry of the delay line structure 4.

The cathode voltage $V_k$ is produced by a voltage generator 6 which, notably in the case of radars, may be a pulse voltage generator (this generator is then generally called a "modulator") delivering a voltage square wave at regular intervals. As a variant, the modulation may also be carried out by a grid 7, receiving a voltage from a modulation voltage $V_m$ generator, referenced 8, biasing the grid 7 at the rate of the pulses to be produced (this modulation then being an "all or nothing" modulation).

A collector electrode 9 receives the residual kinetic energy of the electrons after interaction, this energy being either dissipated in the collector (in which case this collector is grounded) or recovered by means of a collector voltage $V_c$ generator, referenced 10, providing for the recirculation, towards the cathode 1, of the charges recovered at the collector 9. In the latter case, we speak of a "depressed collector", owing to the fact that it is put into depression with respect to the potential of the cathode.

We shall now explain the working of a tube such as this.

The velocity of the electrons accelerated by the potential of the cathode will, in a standard way, be:

$$v_e = [2e/m]^{\frac{1}{2}} \cdot [V_k]^{\frac{1}{2}}, \tag{1}$$

e being the charge of the electron, and
m being the mass of the electron.

It is seen that, for a given cathode potential, this velocity is constant and totally independent of the frequency of the microwave signal to be amplified that is being propagated along the delay line 4.

Besides, the phase velocity of the microwave, i.e. the velocity of this wave as slowed down by the delay structure 4, will have the form:

$$v_\phi = \omega/\beta. \tag{2}$$

$\omega$ being the temporal pulse of the wave, and
$\beta$ being the wave vector,
it being recalled that, since the microwave is a travelling wave, its amplitude A at a point of the tube varies as a function of both the time t and the abscissa x of the point considered on the axis of the tube, whence an expression of the form $A(t,x) = A_o \cos(\omega t - \beta x)$.

This relationship may also be expressed in the form:

$$v_\phi = \omega/\beta(\omega) = 2\pi f/\beta(f). \tag{2b}$$

f being the (temporal) frequency of the microwave considered.

It is seen that this velocity will be highly dependent on the frequency.

Moreover, the factor $\beta(f)$, known as the "dispersion characteristic of the delay structure" is given by a characteristic having a form that is highly complex and variable from one tube to another. It generally nonlinear (an example of such a characteristic is given by FIG. 3).

A difference in velocity will therefore appear between the electron beam and the microwave:

$$\Delta v = v_e - v_\phi = [2e/m]^{\frac{1}{2}} \cdot [V_k]^{\frac{1}{2}} - 2\pi f/\beta(f), \tag{3}$$

which is itself variable (and, in a very complex way, highly dependent on the tube) as a function of the frequency.

More specifically, this difference in velocity will increase with the frequency, prompting a growing desynchronism between the electron beam and the microwave, with a correlative incidence on the output power which will increase in similar proportions. However, beyond a certain value, the desynchronism will be such that the energy exchange between beam and wave will be unstable, causing a sudden drop in the interaction efficiency.

Thus, in tubes such as they have been used up till now, an output power characteristic such as the one illustrated by $C_1$ in FIG. 2 is obtained. This characteristic typically has a wide dynamic range, with a sudden drop at the top of the band (hatchured zone in FIG. 2).

Up till now, the known generators or modulators have been capable, at such levels of voltage or power, of producing only fixed voltages so that it was always the practice, for a given tube, to use a constant voltage $V_k$.

On the contrary, instead of having a fixed cathode voltage, the present invention essentially proposes the variation of this cathode voltage in such a way as to correlatively modify the velocity of the electron beam in order to keep the synchronism between the electron beam and the microwave.

The invention is therefore applicable both to the case of a cathode powered continuously by the potential $V_k$ (tube with continuous emission) and to that of a cathode powered by voltage pulses of a level $V_k$ (modulation tube).

It will be seen that, in the latter case, the invention enables the level of the cathode potential to be varied without difficulty, and hence makes it possible to set up a servo-link, from one pulse to the next one, thus enabling the use, at each new pulse, of a different frequency in the operating band of the tube while, at the same time, keeping a constant output power.

Thus, at the lower frequencies of this band, a higher cathode voltage will be produced for the phase velocity will then be greater. Conversely, at higher frequencies, a lower cathode voltage will be produced for the phase velocity will then be lower.

Thus, for each of the frequencies to be amplified, a cathode voltage will be chosen that enables the phase velocity and the velocity of the electrons to be substantially matched.

Taking account of the relationship (3) given above, the fact of meeting this condition leads to a cathode voltage $V_k(f)$ with the form:

$$V_k(f) = [4\pi^2 f^2/\beta(f)^2] \cdot [m/2e]. \tag{4}$$

In fact, as has been indicated further above, for the interaction to arise, it is necessary that the velocities, while remaining very close to each other, should not be precisely identical.

The cathode voltage $V_k(f)$ should then be given a value with the form:

$$V_k(f) = [4\pi^2 f^2/\beta(f)^2] \cdot [m/2e] + V_\xi(f), \tag{5}$$

$V_\xi(f)$ being a corrective term preventing the velocity of the electrons of the beam and the phase velocity of the microwave from being exactly identical.

Another factor to be taken into account for determining the corrector term $V_\xi(f)$ is, in particular, the coupling impedance between an electron beam and a microwave, that is, in other words, the aptitude of the wave to receive energy from the beam.

Indeed, this impedance depends on the frequency and, as an when the frequency increases, this impedance decreases. To compensate for this phenomenon, $V_\xi(f)$ will be furthermore determined so that, essentially, the electrons give a higher energy at the top of the band than at the bottom of the band, i.e. so that, in other words, there is an impedance x output product that is substantially constant.

$V_\xi(f)$ can also be determined so as to compensate for other non-linearities of the amplifier stage such as, notably, the variations in the SWR as a function of the frequency when going across the operating band.

In other words, when the law of variation of $V_k$ as a function of the frequency is determined, the characteristic of dispersion of the tube of FIG. 3 is not described with precision but with a slight deviation therefrom, firstly in order to avoid being in a situation of perfect synchronism and, secondly, in order to compensate for the variation in the coupling impedance as a function of the frequency and also, as the case may be, other factors (such as the SWR) that depend on the frequency.

With respect to the upper limit $f_2$ of the amplification band of the tube it will be noted that, if the frequency increases, since $V_k$ is reduced, the power given to the tube by the cathode supply will also be reduced.

Indeed, this power provided $P_f$ is given by an expression having the form:

$$P_f = V_k \cdot I_k = V_k(\rho V_k^{3/2}) = \rho V_k^{5/2} \quad (6)$$

$I_k$ being the cathode current, and $\rho$ being the perveance of the tube, this parameter being related to the geometry of the gun and being therefore inherent to the tube used.

It is seen that, for a given output microwave power of constant value, the supply power will decrease very swiftly, up to a limit value of efficiency of the tube (typically for the TWTs, of the order of 50% to 60%) below which it will no longer be possible to produced any amplification. If this limit frequency corresponds to a frequency $f_{C2}$, then the upper value $F_2$ of the working band will be chosen so as to remain always below $f_{C2}$.

It will nonetheless be noted that, unlike in the case of the prior art, at the top of the band, the operation of the tube is particularly stable (i.e. it has little sensitivity to the variations in the microwave input power and in the voltage $V_k$): this constitutes a particularly advantageous feature.

With respect to the lower value $f_1$ of the amplification band of the tube, since $V_k$, and hence the velocity of the electrons, is increased, a substantial level of energy has to be given to the tube, and we are then in operating zones where the efficiency will decrease. In any case, there will always be a theoretical limit constituted by the cut-off frequency $f_{C1}$ of the delay structure in which the microwave gets propagated, a structure that, electrically speaking, constitutes a highpass filter.

Between these values $f_1$ and $f_2$, we obtain an output power such as the one represented by the curve $C_2$ of FIG. 2, i.e. one that is perfectly rectilinear (barring a very small ripple), thus making it possible to have a very wide operating passband.

Thus, with a high power emitter (520 kW mean and 1 MW peak), delivering a microwave pulse signal in S band (2 to 4 GHZ), all that was available hitherto, in the absence of regulation, was a passband of 8% for a 1 dB variation in output power whereas, with a regulation according to the invention, it has been possible to obtain a passband greater than 20%.

The tube implemented was of the TWT type with $\pi$ line and delay line type modulator. The regulation was done in the manner described further below with reference to FIGS. 8 and 9, by placing 20 MOS transistors in parallel on the primary of the pulse transformer, so as to obtain a voltage $V_k$ varying as a function of the frequency by about 15% according to a curve of variation such as the one shown in FIG. 4.

We shall now describe two exemplary embodiments of a tube modulator implementing the teachings of the invention. One of them, described with reference to FIGS. 5 to 9, corresponds to a delay line type of modulator while the other, described with reference to FIGS. 10 to 12, corresponds to a modulator with controlled current source.

In both cases, they are modulators used for the control of a TWT with modulation by the cathode.

It will be noted, however, that these are only particular exemplary embodiments, without any restrictive character, and that the invention, in its broadest aspect, can be applied to a very wide variety of tube amplifier stages, provided that these stages use the interaction of an electron beam with the microwave to be amplified.

We might notably cite:

all types of TWTs: with depressed or non-depressed collectors, with simple or multiple collector, with modulation by the cathode or modulation by the grid, or with coupled cavity, helix, $\pi$ line and other types of delay structures;

and also other types of tubes such as klystrons, crossed-field tube magnetrons, etc.

The implementation of the invention is also independent of the type of modulator used (with delay lines, controlled current etc.) and even the presence of a modulator: the teachings of the invention can indeed apply both to a pulse emission tube and to a continuous emission tube.

FIG. 5 shows a simplified diagram, known per se, of a delay modulator for microwave tubes.

A modulator such as this has a switching supply powered by the three-phase mains, delivering at output, at the terminals of a filtering capacitor 12, a DC voltage of the order of 1,000 V. This DC voltage is applied, after the closing of the switch SW$_1$ and through a high-value inductor 13, to a delay line 14 constituted by a plurality of cascade-connected LC cells. The output of the line may be connected, through a second switch SW$_2$, to a pulse transformer 15, the secondary of which delivers the cathode voltage $V_k$ (for example of the order of 70 KV) and, possibly, if a depressed collector is used, the corresponding collector voltage (for example, of the order of 120 kV).

Initially, the delay line is charged by closing SW$_1$ and opening SW$_2$.

Owing to the presence of the inductance 13, the value of which is far greater than the inductance of the LC cells of the delay line, this delay line will actually behave, essentially, like a capacitive impedance that will be charged with energy through the inductor 13. We thus obtain current and voltage curves i and u illustrated on the timing diagram of FIG. 7.

Once the voltage at the terminals of the delay line 14 has reached a value close to its maximum level (i.e. close to twice the voltage delivered by the switching supply 11), SW$_1$ is opened and SW$_2$ is closed. This prompts the discharge of the energy that has accumulated in the delays lines 14 towards the pulse transformer 15. Since the values of the different elements are computed so that the discharge of the delay line takes place on a value equal to its characteristic impedance, a naturally square pulse discharge (curve I of FIG. 7) is obtained, corresponding to the required modulation of the cathode voltage.

In practice, several modulators are used in parallel, with delay lines having different time constants, in order to optimize the working of the modulator.

Nonetheless, in every case, this modulator behaves like a fixed voltage generator corresponding (cf. equivalent diagram of FIG. 6) to a source of voltage $V_e$ producing a fixed level of voltage of an order of magnitude twice that produced by the source of DC voltage 11 (this is because of the voltage doubler effect during the discharge of the line) said source of voltage $V_e$ having an inherent impedance $Z_o$, corresponding essentially to the inherent impedance of the delay line.

This generator delivers the fixed voltage to an impedance $Z_k$ corresponding to the cathode impedance of the tube seen from the primary of the transformer.

To implement the teachings of the invention, this modulator has to be modified so as to convert the fixed voltage that it delivers into a variable voltage, controlled as a function of the frequency of the microwave, in doing so by means compatible with the extremely high voltage and power levels (of the order of 1 kV/1 MW peak) achieved during the production of this cathode voltage.

As shown in FIG. 8 it is possible, to this end, notably to place a controlled current source 16 in a bypass connection on the primary of the pulse transformer 15 (i.e. as a bypass on the impedance $Z_{kR}$). This current source 16 will branch off a part of the current I produced by the discharge of the delay line.

In such a circuit, the currents and the voltages are governed by the relationship:

$$2V_e = Z_o \cdot I + V_k = Z_o(I_k + I_r) + V_k \qquad (7)$$

$Z_O$ being the internal impedance of the voltage source,
I being the current delivered by this voltage source,
$I_k$ being the cathode current, and
$I_r$ being the regulation current, i.e. the current branched off by the current source added to the circuit
(the cathode voltage $V_k$ will be identified with the voltage produced by the generator at the terminals of $Z_k$, there being little difference in these two values).

Whence we derive:

$$V_k \approx 2V_e - Z_o(I_k + I_r) = C^{te} - Z_o \cdot I_r \qquad (8)$$

It is thus seen that, to obtain a regulation of the cathode voltage having the shape shown in FIG. 4, a minimal (for example zero) regulation current $I_r$ will be chosen at the bottom of the band and a maximum regulation current will be chosen at the top of the band.

Typically, for the values of the above-mentioned example, we have, for $f=f_1$, $I_r=0$ and $I_k=2800$ A and, for $f=f_2$, $I_r=600$ A approximately and $I_k=2200$ A.

The making of a variable current generator such as this implies high voltages as well as high currents (typically voltages that may attain values of 900 V at the terminals of the generator, for currents ranging from 0 to 600 A).

It is possible, for example, to use a structure such as the one illustrated in FIG. 6, where the current source 16 is formed by a battery of elementary sources 17, all parallel connected. There are, for example, 20 elementary sources.

Each of these elementary sources is constituted by a power MOS transistor 18 (for example a transistor with values of 1000 V, 500 W and 60 A peak) in series with a resistor 19 (so that the essential part of the voltage drops at the terminals of this resistor), each of the transistors being controlled by a respective voltage $V_{gs1} \ldots V_{gsn}$ produced by a respective source 20 and applied selectively by means of a switch 21.

With n=20 similar stages, it is possible to obtain a current generator that generates current of 0–600 A in steps of 30 amperes, selectively controlled by the activation of the switches 21.

The switching operations to be done as a function of the frequency may be tabulated, for example in a programmable read-only memory that selectively controls the closing of the different switches 21.

The operating point of each of the MOS transistors is chosen in such a way that they work as current generators, i.e. between drain and source they let through a current proportional to the voltage $V_{gs1} \ldots V_{gsn}$ applied between gate and source.

Instead of providing for stages that are all identical, it would be possible to provide for currents that are different for some of them, thus making it possible to obtain finer variation steps, the switching law being, here again, tabulated in a programmable read-only memory indicating the different switching operations to be performed as a function of the desired voltage $V_k$, i.e. as a function of the frequency of the microwave.

Figure 11:
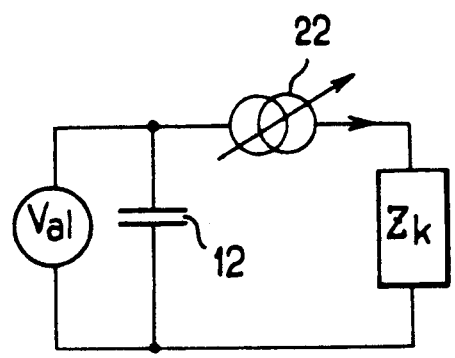
FIG. 11 is a an equivalent diagram of this same modulator, but one made according to the teachings of the present invention.
Figure 12:
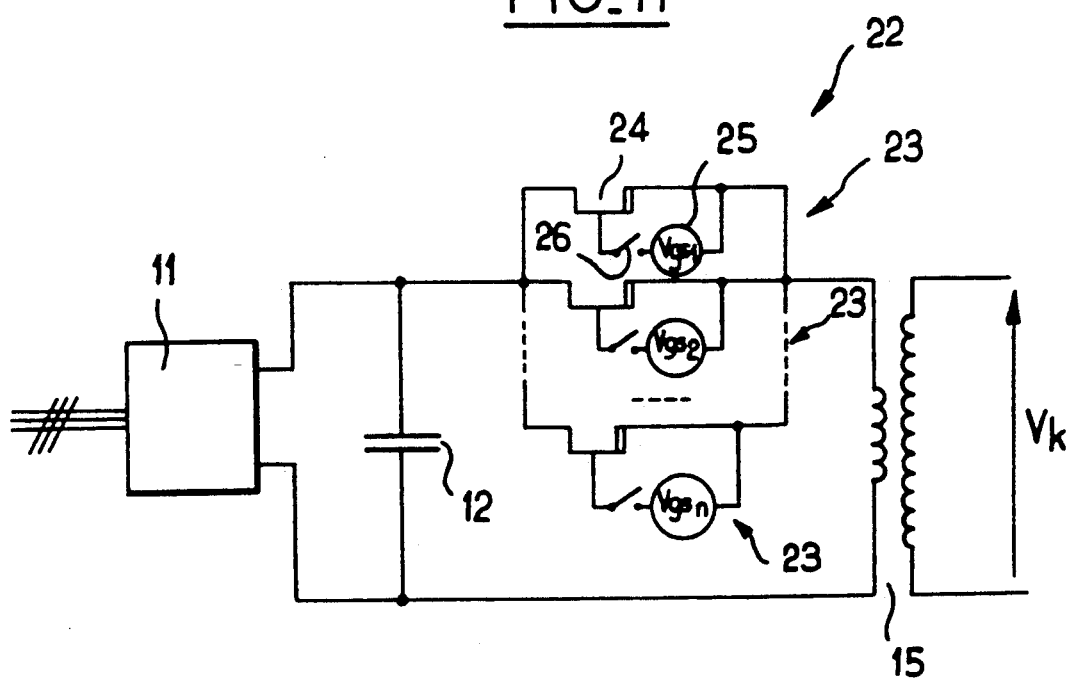
FIG. 12 gives a simplified view of an embodiment of a modulator with current control such as this, according to the teachings of the present invention.

FIGS. 10 to 12 show another possible embodiment in which it is no longer a delay line modulator but a controlled current modulator that is used.

The simplified diagram, which is known per se, of a modulator such as this, is illustrated in FIG. 10. Here again, the switching supply 10 delivers a DC voltage of the order of 1000 V, but the filtering capacitor 12 is used herein to store the energy.

When it is desired to apply the current to the tube, SW$_1$ is closed. This procedures the discharge of the capacitor 12 in the pulse converter 15.

To implement the teachings of the invention, the switch SW$_1$ is replaced by a variable current generator 22, as illustrated in the equivalent diagram of FIG. 11, so that the current in the primary of the transformer 15, and hence the square-wave voltage applied to the cathode of the tube, depend on the frequency.

To this effect, it is possible to use an assembly such as the one shown in FIG. 12, wherein the variable current source 22 is constituted by a battery of parallel-connected elementary sources 23, each including a power MOS transistor 24, the operating current of which is controlled by a voltage $V_{gs1} \ldots V_{gsn}$ delivered by a source 25 selectively through a switch 26.

As in the case of FIG. 9, it is thus possible, by choosing an appropriate relationship of the switching of the different switches 26, to obtain an incremental variation in the current in the primary of the transformer 15, and hence in the level of voltage $V_k$ delivered to the secondary of this same transformer, according to a relationship of variation such as the one illustrated in FIG. 4.

What is claimed is:

1. An amplifier stage comprising a microwave tube, of the type having a cathode and a delay structure, wherein an electron beam is made to interact with a microwave having a frequency variable within a given useful range, the velocity of the electrons of the beam being determined by a cathode voltage applied to the tube and the microwave being propagated in said delay structure that imposes a phase velocity close to the velocity of the electron beam on said microwave, said amplifier stage further including supply means that give a variable cathode voltage, regulated as a function of said frequency, said voltage varying with the frequency to modify the velocity of the electrons of the beam in such a way that, for every frequency of said useful range of frequencies, the corresponding velocity of these electrons remains essentially, but not precisely, identical to the phase velocity of the microwave.

2. The amplifier stage of claim 1, wherein the cathode voltage is essentially determined by the relationship:

$$V_k(f) = [4\pi^2 f^2/\beta(f)^2] \cdot [m/2e] + V_\xi(f),$$

$V_k(f)$ being the cathode voltage;
f being the frequency of the microwave;
$\beta(f)$ being the characteristic of dispersivity of the delay structure,
m being the mass of the electron,
e being the charge of the electron, and
$V_\xi(f)$ being a corrective term providing for a velocity of the electrons and a phase velocity of the microwave such that these velocities are close to each other.

3. The amplifier tube of claim 1 wherein, the tube being a tube with modulation by the cathode driven by a modulator forming a voltage source giving the tube an essentially constant cathode voltage, there is provision for voltage reduction means enabling the cathode voltage effectively applied to the tube to be reduced variably as a function of the frequency.

4. The amplifier stage of claim 3, wherein said voltage reducing means include means for the branching-off, variably as a function of the frequency, of a fraction of the current delivered to the tube by said voltage source so as to achieve a correlative and controlled reduction in the cathode voltage effectively applied to the tube, given the voltage drop due to the internal impedance of said voltage source.

5. The amplifier stage of claim 4, wherein the voltage reducing means advantageously include a current source adjustable as a function of the frequency, mounted in a bypass connection on the cathode circuit of the tube.

6. The amplifier stage of claim 5, wherein said current source includes a plurality of parallel-connected elementary current sources, each of these elementary current sources being selectively activated as a function of the frequency so as to obtain the desired value of branched-off current for the unit.

7. The amplifier stage of claim 6, wherein each of said elementary current sources comprises a power MOS transistor, controlled as a current generator and series-connected with a resistor of fixed value.

8. The amplifier stage of claim 1 wherein, the tube being a tube with modulation by the cathode driven by a modulator with controlled current source, the controlled current source is adjustable as a function of the frequency in such a way as to achieve a correlative and controlled reduction in the cathode voltage applied to the tube.

9. The amplifier stage of claim 8, wherein said current source controlled as a function of the frequency includes a plurality of parallel-connected elementary current sources, each of these elementary current sources being selectively activated as a function of the frequency so as to obtain, for the unit, the value of current corresponding to the desired cathode voltage.

10. The amplifier stage of claim 9, wherein each of said elementary current sources comprises a power MOS transistor, controlled as a current generator.

* * * * *